United States Patent
Hayashi et al.

(10) Patent No.: US 8,029,968 B2
(45) Date of Patent: Oct. 4, 2011

(54) POSITIVE RESIST COMPOSITION AND METHOD FOR RESIST PATTERN FORMATION

(75) Inventors: Ryotaro Hayashi, Kawasaki (JP); Satoshi Yamada, Kawasaki (JP); Makiko Irie, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 606 days.

(21) Appl. No.: 11/570,399

(22) PCT Filed: Jun. 17, 2005

(86) PCT No.: PCT/JP2005/011148
§ 371 (c)(1),
(2), (4) Date: Dec. 11, 2006

(87) PCT Pub. No.: WO2006/003800
PCT Pub. Date: Jan. 12, 2006

(65) Prior Publication Data
US 2008/0268375 A1    Oct. 30, 2008

(30) Foreign Application Priority Data
Jul. 2, 2004   (JP) ................................ 2004-196567

(51) Int. Cl.
G03F 7/004      (2006.01)
G03F 7/30       (2006.01)

(52) U.S. Cl. ........................ 430/270.1; 430/326; 430/910

(58) Field of Classification Search ............... 430/270.1, 430/910, 326
See application file for complete search history.

(56) References Cited

U.S. PATENT DOCUMENTS

| | | | |
|---|---|---|---|
| 6,680,159 B2 * | 1/2004 | Barclay et al. | 430/270.1 |
| 6,746,818 B2 * | 6/2004 | Kinsho et al. | 430/270.1 |
| 6,777,157 B1 * | 8/2004 | Barclay et al. | 430/270.1 |
| 6,824,956 B2 | 11/2004 | Sato | |
| 7,135,270 B2 | 11/2006 | Watanabe et al. | |
| 7,157,207 B2 * | 1/2007 | Funatsu et al. | 430/270.1 |
| 7,179,579 B2 | 2/2007 | Uenishi | |
| 2004/0058269 A1 | 3/2004 | Hada et al. | |
| 2004/0063882 A1 * | 4/2004 | Kamon et al. | 526/266 |
| 2004/0110085 A1 | 6/2004 | Iwai et al. | |
| 2004/0202954 A1 | 10/2004 | Momota et al. | |
| 2005/0014087 A1 * | 1/2005 | Nishimura et al. | 430/270.1 |
| 2005/0113538 A1 * | 5/2005 | Kamon et al. | 526/266 |
| 2005/0130056 A1 * | 6/2005 | Ogata et al. | 430/270.1 |
| 2005/0227174 A1 * | 10/2005 | Hatakeyama et al. | 430/270.1 |

FOREIGN PATENT DOCUMENTS

| | | |
|---|---|---|
| JP | 04-039665 | 2/1992 |
| JP | 2002-236359 | 8/2002 |
| JP | 2003-005375 | 1/2003 |
| JP | 2003-192734 | 7/2003 |
| JP | 2003-223001 | 8/2003 |
| JP | 2003-233188 | 8/2003 |
| JP | 2003-241379 | 8/2003 |
| JP | 2003-345023 | 12/2003 |
| JP | 2004-341247 | 12/2004 |
| JP | 2005-054142 | 3/2005 |
| JP | 2005-099275 | 4/2005 |
| JP | 2005-309376 | 11/2005 |

OTHER PUBLICATIONS

Office Action issued on Jun. 24, 2008, on the counterpart Japanese Application No. 2004-196567.

\* cited by examiner

*Primary Examiner* — John Chu
(74) *Attorney, Agent, or Firm* — Knobbe Martens Olson & Bear LLP

(57) ABSTRACT

A positive resist composition with a broad DOF and a method for resist pattern formation are provided. This composition is a positive resist composition which includes a resin component (A) that exhibits increased alkali solubility under the action of acid and an acid generator component (B) that generates acid upon exposure, wherein the component (A) is a copolymer that contains n [wherein, n is an integer from 4 to 6] structural units with mutually different structures, and the proportion of each structural unit within the copolymer is greater than 0 mol % but no higher than 100/(n−1) mol %.

10 Claims, No Drawings

POSITIVE RESIST COMPOSITION AND METHOD FOR RESIST PATTERN FORMATION

RELATED APPLICATIONS

This application is the U.S. National Phase filing under 35 U.S.C. §371 of PCT/JP2005/011148, filed Jun. 17, 2005, which designated the United States and was published in a language other than English, which claims priority under 35 U.S.C. §119(a)-(d) to Japanese Patent Application No. 2004-196567, filed Jul. 2, 2004. The content of these applications is incorporated herein by reference in their entireties.

TECHNICAL FIELD

The present invention relates to a positive resist composition and a method for resist pattern formation.

BACKGROUND ART

In recent years, in the production of semiconductor elements and liquid crystal display elements, advances in lithography techniques have lead to rapid progress in the field of miniaturization. Typically, these miniaturization techniques involve shortening the wavelength of the exposure light source. Conventionally, ultraviolet radiation typified by g-line and i-line radiation has been used, but nowadays KrF excimer lasers (248 nm) are the main light source used in mass production, and ArF excimer lasers (193 nm) are now also starting to be introduced in mass production. Furthermore, research is also being conducted into lithography techniques that use $F_2$ excimer lasers (157 nm), EUV (extreme ultraviolet radiation), and EB (electron beams) and the like as the light source (radiation source).

Resists for use with these types of short wavelength light sources require a high resolution capable of reproducing patterns of minute dimensions, and a high level of sensitivity relative to these types of short wavelength light sources. One example of a known resist that satisfies these conditions is a chemically amplified resist, which includes a base resin and an acid generator (hereafter referred to as a PAG) that generates acid upon exposure, and these chemically amplified resists include positive resists in which the alkali solubility of the exposed portions increases, and negative resists in which the alkali solubility of the exposed portions decreases.

Until recently, polyhydroxystyrene (PHS) or derivative resins thereof in which the hydroxyl groups have been protected with acid-dissociable, dissolution-inhibiting groups (PHS-based resins), which exhibit high transparency relative to a KrF excimer laser (248 nm), have been used as the base resin component of chemically amplified resists. However because PHS-based resins contain aromatic rings such as benzene rings, their transparency is inadequate for light with wavelengths shorter than 248 nm, such as light of 193 nm. Accordingly, chemically amplified resists that use a PHS-based resin as the base resin component suffer from low levels of resolution in processes that, for example, use light of 193 nm.

As a result, resins that contain structural units derived from (meth)acrylate esters within the principal chain (acrylic resins) are now widely used as base resins for resists that use ArF excimer laser lithography, as they offer excellent transparency in the vicinity of 193 nm (for example, see patent reference 1 and patent reference 2).

[Patent Reference 1]
Japanese Patent (Granted) Publication No. 2,881,969
[Patent Reference 2]
Japanese Unexamined Patent Application, First Publication No. 2003-241385

DISCLOSURE OF INVENTION

Problems to be Solved by the Invention

The invention disclosed in the above patent reference 2 exhibits superior properties of sensitivity, resolution, depth of focus (DOF), and the like. However, ongoing miniaturization of semiconductor devices has lead to demands for further improvements in the above properties, particularly in the case of DOF. The DOF refers to the range, at any given exposure dose, across which the exposure focal point can vary and yet still yield a favorable resolution, and larger DOF values are preferred as they enable lager process margins during pattern formation.

The present invention addresses the circumstances described above, with an object of providing a positive resist composition and a method for resist pattern formation that provide excellent sensitivity and resolution, and a particularly broad DOF.

Means for Solving the Problems

As a result of intensive investigation, the inventors of the present invention discovered that by using, as a base resin, a resin containing from 4 to 6 structural units, in which the proportion of each of these structural units within the resin fell within a specific range, the above object could be achieved, and they were therefore able to complete the present invention.

In other words, a first aspect of the present invention provides a positive resist composition, including a resin component (A) that exhibits increased alkali solubility under the action of acid, and an acid generator component (B) that generates acid upon exposure, wherein the component (A) is a copolymer that contains n [wherein, n is an integer from 4 to 6] structural units with mutually different structures, and the proportion of each structural unit within the copolymer is greater than 0 mol % but no higher than 100/(n−1) mol %.

A second aspect of the present invention provides a method for resist pattern formation, and includes the steps of forming a resist film on a substrate using a positive resist composition according to the first aspect, conducting selective exposure of the resist film, and subsequently conducting alkali developing to form the resist pattern.

In the present invention, the term "structural unit" refers to a monomer unit that contributes to the formation of a polymer. The term "exposure" is used as a general concept that includes irradiation with any form of radiation.

Effects of the Invention

According to the present invention, there are provided a positive resist composition and a method for resist pattern formation that exhibit excellent sensitivity and resolution, and a broad DOF.

BEST MODE FOR CARRYING OUT THE INVENTION

As follows is a more detailed description of the present invention.

<<Resist Composition>>

A resist composition of the present invention includes a resin component (A) that undergoes a change in alkali solubility under the action of acid (hereafter referred to as the component (A)), and an acid generator component that generates acid upon exposure (hereafter referred to as the component (B)).

<Component (A)>

In the present invention, the component (A) is a copolymer that contains n [wherein, n is an integer from 4 to 6] structural units with mutually different structures, wherein the proportion of each structural unit within the copolymer is greater than 0 mol % but no higher than 100/(n−1) mol %. The proportions are selected such that the combination of all the structural units totals 100 mol %.

In other words, in those cases where the component (A) is a copolymer containing four (n=4) structural units (hereafter also referred to as a quaternary copolymer), the proportion of each of the structural units, relative to the combined total of all the structural units that constitute the component (A), is greater than 0 mol %, but no higher than 100/3 mol %≈33.3 mol %. In this case, the decimal point is removed, and the upper limit is set to 34 mol %, and the proportion of each structural unit is preferably within a range from 5 to 34 mol %, and even more preferably from 10 to 34 mol %.

Furthermore, in those cases where the component (A) is a copolymer containing five (n=5) structural units (hereafter also referred to as a quinary copolymer), the proportion of each of the structural units, relative to the combined total of all the structural units that constitute the component (A), is greater than 0 mol %, but no higher than 100/4 mol % 25 mol %. The proportion of each structural unit is preferably within a range from 5 to 25 mol %, and even more preferably from 10 to 25 mol %.

Furthermore, in those cases where the component (A) is a copolymer containing six (n=6) structural units (hereafter also referred to as a senary copolymer), the proportion of each of the structural units, relative to the combined total of all the structural units that constitute the component (A), is greater than 0 mol %, but no higher than 100/5 mol %=20 mol %. The proportion of each structural unit is preferably within a range from 5 to 20 mol %, and even more preferably from 8 to 20 mol %.

Furthermore, in the component (A), values of n of 4 or 5 are preferred as they yield a greater improvement in the DOF.

Furthermore, provided the ratios (molar ratios) of the n structural units within the component (A) satisfy the range defined above, there are no particular restrictions on the individual ratios, although copolymers in which the proportions of each of the structural units are close to equal are preferred. In other words, if the difference between the ratios of each of the structural units is within ±15%, preferably within ±12%, and even more preferably within ±5%, then a resin with a more uniform structural unit composition results, and this improves the randomness within the resin itself, which is thought to contribute to an improvement in the DOF. For example, in the case where the component (A) is a quaternary copolymer, ratios of 18 to 32:18 to 32:18 to 32:18 to 32 are preferred, and ratios of 20 to 30:20 to 30:20 to 30:20 to 30 are even more desirable. In the case of a quinary copolymer, ratios of 15 to 24:15 to 24:15 to 24:15 to 24 are preferred, and ratios of 18 to 22:18 to 22:18 to 22:18 to 22 are even more desirable. As described above, the proportions of each of the structural units are selected such that the combination of all the structural units totals 100 mol %.

In this description, the expression "mutually different structures" means that a comparison of the chemical structures reveals non-identical structures.

For example, if a methacrylate ester and an acrylate ester are compared, then even if the ester portions are identical, the methacrylate ester has a "mutually different structure" from the acrylate ester in that the hydrogen atom bonded to the α-carbon atom of the acrylate ester has been substituted with a lower alkyl group. For example, a structural unit derived from γ-butyrolactone methacrylate is mutually different from a structural unit derived from γ-butyrolactone acrylate.

Furthermore, in the case of structural units containing an alkyl group as a substituent group, a structural unit in which the alkyl group is a methyl group is mutually different from a structural unit in which the alkyl group is an ethyl group.

In the present invention, using a component (A) with the configuration described above improves the DOF. Although the reason for this improvement is not entirely clear, it is thought that by ensuring the proportion of each of the structural units falls within the ranges described above, the monomers that give rise to each of the structural units can be mixed together more uniformly during polymerization of the monomers, and that as a result, the dispersion (randomness) of each of the structural units within the resulting copolymer can be improved. In other words, it is surmised that when the copolymer is used to form a resist film, this improvement in randomness eliminates film density irregularities and yields improved densification, meaning that the diffusion length within the film of the acid generated from the component (B) by exposure shortens, which results in an improvement in the contrast and a broadening of the DOF.

In the present invention, a reduction in the risk of defects can also be expected. It is surmised that this observation is a reflection of the fact that because the randomness of each of the structural units within the copolymer is thought to improve in the manner described above, the difference in the solubility of different portions of the copolymer within organic solvents or alkali developing solutions can be minimized.

The component (A) preferably contains structural units (a) derived from (meth)acrylate esters. By including the structural units (a), a copolymer is obtained that exhibits satisfactory transparency for use within resists for processes that use wavelengths of 200 nm or shorter, such as an ArF excimer laser.

In the description of the present invention, the term "(meth) acrylate ester" is a generic term that includes methacrylate esters and/or acrylate esters. Furthermore, the term "structural unit derived from a (meth)acrylate ester" refers to a structural unit that is formed by the cleavage of the ethylenic double bond of a (meth)acrylate ester.

In the present invention, components (A) in which the structural units (a) account for at least 60 mol %, and preferably 80 mol % or greater, and most preferably 100 mol % yield superior resist compositions, and are consequently preferred.

[Structural Unit (a1)]

The structural units (a) preferably include a structural unit (a1) derived from a (meth)acrylate ester that contains an acid-dissociable, dissolution-inhibiting group.

There are no particular restrictions on the acid-dissociable, dissolution-inhibiting group within the structural unit (a1). Typically, groups that form a cyclic or chain-like tertiary alkyl ester with the carboxyl group of the (meth)acrylate are the most widely known, but from the viewpoints of achieving superior dry etching resistance and favorable resist pattern formation, the use of an acid-dissociable, dissolution-inhibiting group that contains a monocyclic or polycyclic aliphatic cyclic group (alicyclic group) is preferred.

In this description, the term "aliphatic" is a relative concept used in relation to the term "aromatic", and defines a group or compound that contains no aromaticity. The term "monocyclic aliphatic cyclic group" describes a monocyclic group that contains no aromaticity, whereas the term "polycyclic aliphatic cyclic group" describes a polycyclic group that contains no aromaticity. There are no particular restrictions on the "aliphatic monocyclic groups" and "aliphatic polycyclic groups", provided they are groups formed from carbon and hydrogen, although hydrocarbon groups are preferred. The "aliphatic monocyclic groups" and "aliphatic polycyclic groups" may be either saturated or unsaturated, but are usually preferably saturated.

Examples of suitable monocyclic alicyclic groups include groups in which one hydrogen atom has been removed from a monocycloalkane such as cyclohexane or cyclopentane.

Examples of suitable polycyclic alicyclic groups include groups in which one or two hydrogen atoms have been removed from a polycycloalkane such as a bicycloalkane, tricycloalkane or tetracycloalkane, and specific examples include groups in which one or two hydrogen atoms have been removed from a polycycloalkane such as adamantane, norbornane, isobornane, tricyclodecane or tetracyclododecane.

These types of monocyclic and polycyclic alicyclic groups can be appropriately selected from the multitude of groups proposed for the resin components of resist compositions designed for use with ArF excimer lasers.

Of these groups, a cyclohexyl group, cyclopentyl group, adamantyl group, norbornyl group, or tetracyclododecanyl group is preferred in terms of industrial availability, and a cyclohexyl group, cyclopentyl group, or adamantyl group is particularly desirable.

Specific examples of the structural unit (a1) include structural units derived from a (meth)acrylate ester that contains a monocyclic alicyclic group-containing acid-dissociable, dissolution-inhibiting group, such as the structural units represented by a general formula (10) shown below, and structural units derived from a (meth)acrylate ester that contains a polycyclic alicyclic group-containing acid-dissociable, dissolution-inhibiting group, such as the structural units represented by the general formulas (11), (12) and (13) shown below.

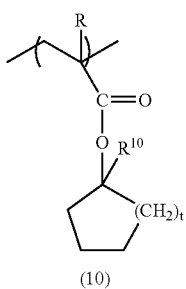

(10)

[Formula 1]

[In the formula (10), R represents a hydrogen atom or a methyl group, $R^{10}$ represents a lower alkyl group, and t represents an integer from 1 to 3.]

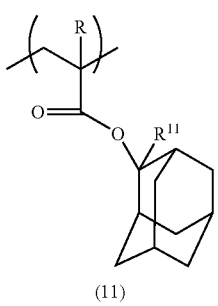

(11)

[Formula 2]

[In the formula (11), R represents a hydrogen atom or a methyl group, and $R^{11}$ represents a lower alkyl group.]

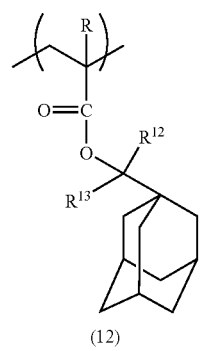

(12)

[Formula 3]

[In the formula (12), R represents a hydrogen atom or a methyl group, and $R^{12}$ and $R^{13}$ each represent, independently, a lower alkyl group.]

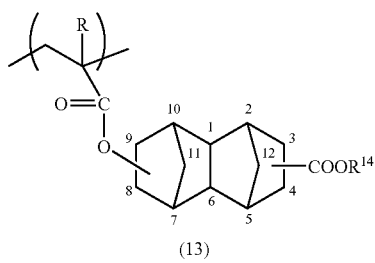

(13)

[Formula 4]

[In the formula (13), R represents a hydrogen atom or a methyl group, and $R^{14}$ represents a tertiary alkyl group.]

In the formula (10), the group $R^{10}$ is preferably a straight-chain or branched lower alkyl group of 1 to 5 carbon atoms, and specific examples include a methyl group, ethyl group, propyl group, isopropyl group, n-butyl group, isobutyl group, pentyl group, isopentyl group, or neopentyl group. Of these, an alkyl group of two or more carbon atoms, and particularly from 2 to 5 carbon atoms, is preferred, and such groups tend to produce increased acid dissociability compared with the case of a methyl group. From an industrial viewpoint, a methyl group or ethyl group is preferred.

t represents an integer from 1 to 3, although is preferably either 1 or 2 from the viewpoints of synthesis and industrial availability, and is most preferably 2.

In the present invention, the case in which $R^{10}$ is an ethyl group and t represents 2 within the formula (10) is particularly preferred. In other words, a structural unit that contains a 1-ethyl-1-cyclohexyl group as the acid-dissociable, dissolution-inhibiting group exhibits particularly superior levels of the effects described above, and is consequently preferred.

In the formula (11), the group $R^{11}$ is preferably a straight-chain or branched lower alkyl group of 1 to 5 carbon atoms, and specific examples include a methyl group, ethyl group, propyl group, isopropyl group, n-butyl group, isobutyl group, pentyl group, isopentyl group, or neopentyl group. Of these, an alkyl group of two or more carbon atoms, and particularly from 2 to 5 carbon atoms, is preferred, and such groups tend to yield a higher acid dissociability than the case of a methyl group. From an industrial viewpoint, a methyl group or ethyl group is preferred.

In the formula (12), the groups $R^{12}$ and $R^{13}$ each preferably represent, independently, a lower alkyl group of 1 to 5 carbon atoms. These types of groups tend to exhibit a higher acid dissociability than a 2-methyl-2-adamantyl group.

Specifically, the groups $R^{12}$ and $R^{13}$ each preferably represent, independently, the same types of straight-chain or branched lower alkyl groups described above for $R^{11}$. Of these groups, the case in which $R^{12}$ and $R^{13}$ are both methyl groups is preferred from an industrial viewpoint, and a structural unit derived from 2-(1-adamantyl)-2-propyl (meth)acrylate is a specific example.

The group $R^{14}$ represents a tertiary alkyl group such as a tert-butyl group or tert-amyl group, tertiary alkyl groups of either 4 or 5 carbon atoms are preferred, and the case in which $R^{14}$ is tert-butyl group is preferred industrially.

Furthermore, the group —COOR$^{14}$ may be bonded to either position 3 or 4 of the tetracyclododecanyl group shown in the formula (13), although a mixture of both isomers results, and so the bonding position cannot be further specified. Furthermore, the carboxyl group residue of the (meth)acrylate ester may be bonded to either position 8 or 9 in the FIGURE, although similarly, the bonding position cannot be further specified.

Of the above possibilities, structural units of the formula (10) in which t is either 1 or 2, namely, structural units derived from 1-alkyl-1-cyclopentyl (meth)acrylates or structural units derived from 1-alkyl-1-cyclohexyl (meth)acrylates, and structural units represented by the formula (11), namely, structural units derived from 2-alkyl-2-adamantly (meth)acrylates, exhibit particularly broad DOF values, and excellent lithography properties such as sensitivity and resolution, and are consequently preferred.

The proportion of the structural unit (a1) within the component (A), relative to the combined total of all the structural units that constitute the component (A), is preferably within a range from 5 to 60 mol %, and even more preferably from 5 to 50 mol %. Ensuring that this proportion is at least as large as the lower limit of the above range enables a more favorable pattern to be obtained when the component is used within a resist composition, whereas ensuring that the proportion is no greater than the upper limit enables a more favorable balance to be achieved with the other structural units.

Here, the expression "proportion of the structural unit (a1)" refers to the quantity of the structural unit in those cases where the structural unit (a1) includes a single type of structural unit, or in those cases where the structural unit (a1) includes a plurality of different types of structural units, refers to the combined total of that plurality of structural units. In those cases where the structural unit (a1) includes a plurality of different structural units, the proportion of each of those structurally mutually different structural units is, in the same manner as described above, greater than 0 mol %, but no higher than 100/(n−1) mol %.

Structural Unit (a2)

The component (A) of the present invention preferably also includes, as a structural unit (a) and in addition to the structural unit (a1), a structural unit (a2) derived from a (meth)acrylate ester that contains a lactone-containing monocyclic or polycyclic group.

Including such a structural unit improves the adhesion between the resist film and the substrate, and inhibits the occurrence of pattern collapse and film peeling and the like within fine resist patterns. Furthermore, the hydrophilicity of the component (A) is also enhanced, thereby improving the affinity with the developing solution, improving the alkali solubility within the exposed portions of the resist, and contributing to an improvement in the resolution.

Examples of the structural unit (a2) include structural units in which a monocyclic group composed of a lactone ring, or a polycyclic group containing a lactone ring and an alicyclic group bonded thereto, is bonded to the ester side chain portion of a (meth)acrylate ester.

The term "lactone ring" refers to a single ring containing a —O—C(O)— structure, and this ring is counted as the first ring. Accordingly, the case in which the only ring structure is the lactone ring is referred to as a monocyclic group, and groups containing other ring structures are described as polycyclic groups regardless of the structure of the other rings.

Examples of the lactone-containing monocyclic or polycyclic groups include monocyclic groups in which one hydrogen atom has been removed from γ-butyrolactone, and polycyclic groups in which one hydrogen atom has been removed from a lactone ring-containing bicycloalkane, lactone ring-containing tricycloalkane, or lactone ring-containing tetracycloalkane.

Specific examples include structural units derived from a (meth)acrylate ester containing a monocyclic group composed of a monocyclic lactone ring, such as the structural units represented by a general formula (21) shown below, and structural units derived from a (meth)acrylate ester containing a polycyclic group that contains a lactone ring, such as the structural units represented by formulas (22) through (25) shown below.

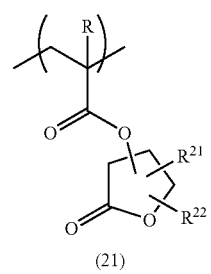

[Formula 5]

(21)

[In the formula (21), R represents a hydrogen atom or a methyl group, and $R^{21}$ and $R^{22}$ each represent, independently, a hydrogen atom or a lower alkyl group.]

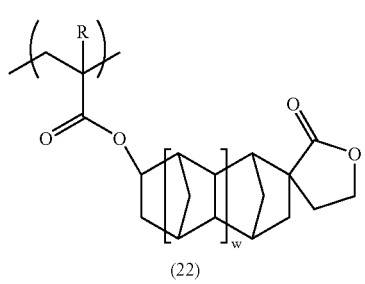

[Formula 6]

(22)

[In the formula (22), R is as defined above, and w represents either 0 or 1.]

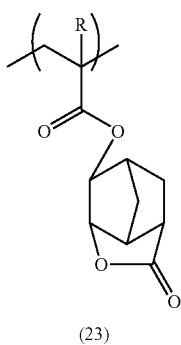

(23)

[In the formula (23), R is as defined above.]

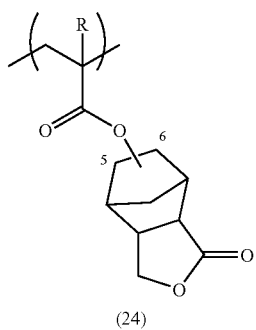

(24)

[In the formula (23), R is as defined above.]

This structural unit exists as a mixture of isomers in which the bonding position is either position 5 or position 6.

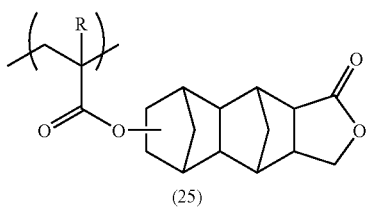

(25)

[In the formula (25), R is as defined above.]

In the general formula (21), $R^{21}$ and $R^{22}$ each represent, independently, a hydrogen atom or a lower alkyl group, although in terms of industrial availability, preferably represent a hydrogen atom.

Suitable lower alkyl groups for $R^{21}$ and $R^{22}$ include both straight-chain and branched groups, and alkyl groups of 1 to 5 carbon atoms are preferred, with specific examples including a methyl group, ethyl group, propyl group, isopropyl group, n-butyl group, isobutyl group, pentyl group, isopentyl group, or neopentyl group.

Furthermore, of the above structural units represented by the general formulas (21) through (25), (meth)acrylate butyrolactone esters represented by the general formula (21), namely structural units derived from (meth)acrylate esters of butyrolactone, are preferred in terms of suppression and reduction of the proximity effect.

Furthermore, (meth)acrylate norbornane lactone esters represented by the general formulas (23) and (24), namely structural units derived from norbornane lactone (meth)acrylates, are also preferred as they provide further improvement in the resulting resist pattern shape, including the dry etching resistance and the rectangular formability.

Amongst these general formulas (21) to (25), structural units represented by the general formula (21) and structural units represented by the general formula (24) are the most preferred in terms of the effects of the present invention, and of these, (meth)acrylate γ-butyrolactone esters of the general formula (21) in which $R^{21}$ and $R^{22}$ are hydrogen atoms and the ester linkage is bonded to the α-carbon atom of the lactone ring, namely structural units derived from γ-butyrolactone (meth)acrylate, are the most desirable.

As the structural unit (a2), either a single type of structural unit may be used alone, or a combination of two or more different types of structural unit may be used.

The proportion of the structural unit (a2), relative to the combined total of all the structural units that constitute the component (A), is preferably within a range from 5 to 80 mol %, and even more preferably from 5 to 60 mol %. Ensuring that this proportion is at least as large as the lower limit of the above provides superior effects for the present invention, whereas ensuring that the proportion is no greater than the upper limit enables a more favorable balance to be achieved with the other structural units.

Here, the expression "proportion of the structural unit (a2)" refers to the quantity of the structural unit in those cases where the structural unit (a2) includes a single type of structural unit, or in those cases where the structural unit (a2) includes a plurality of different types of structural units, refers to the combined total of that plurality of structural units. In those cases where the structural unit (a2) includes a plurality of different structural units, the proportion of each of those structurally mutually different structural units is, in the same manner as described above, greater than 0 mol %, but no higher than 100/(n−1) mol %.

Structural Unit (a3)

In a component (A), the structural units (a) preferably also include, either in addition to the structural unit (a1), or in addition to the structural unit (a1) and the structural unit (a2), a structural unit (a3) derived from a (meth)acrylate ester that contains a polar group-containing aliphatic hydrocarbon group. Including such a structural unit enhances the hydrophilicity of the component (A), thereby improving the affinity with the developing solution, improving the alkali solubility within the exposed portions of the resist, and contributing to an improvement in the resolution.

Examples of the polar group include a hydroxyl group or cyano group or the like, although a hydroxyl group is particularly preferred.

Examples of the aliphatic hydrocarbon group include straight-chain or branched hydrocarbon groups (alkylene groups) of 1 to 10 carbon atoms, and polycyclic aliphatic hydrocarbon groups (polycyclic groups). These polycyclic groups can be selected appropriately from the same multitude of polycyclic groups described above in relation to the structural unit (a1).

When the hydrocarbon group within the polar group-containing aliphatic hydrocarbon group is a straight-chain or branched hydrocarbon group of 1 to 10 carbon atoms, the structural unit (a3) is preferably a structural unit derived from the hydroxyethyl ester of a (meth)acrylate, whereas when the hydrocarbon group is a polycyclic group, structural units represented by general formulas (31) and (32) shown below are preferred. In terms of enhancing the hydrophilicity of the component (A), thereby improving the affinity with the developing solution, improving the alkali solubility within the exposed portions of the resist, and improving the resolution, structural units represented by the general formula (31), namely structural units derived from a hydroxyadamantyl (meth)acrylate, are particularly preferred.

[Formula 10]

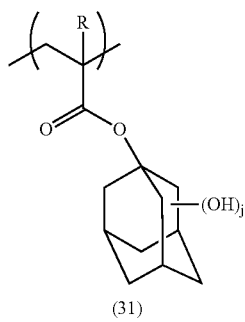

(31)

(In the formula (31), R is as defined above, and j represents an integer from 1 to 3.)

Of these, structural units in which j is 1, and the hydroxyl group is bonded to position 3 of the adamantyl group are preferred.

[Formula 11]

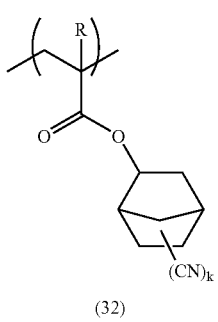

(32)

(In the formula (32), R is as defined above, and k represents an integer from 1 to 3.)

Of these, structural units in which k is 1 are preferred. These structural units exist as a mixture of isomers (that is, a mixture of compounds in which the cyano group is bonded to either position 4 or position 5 of the norbornyl group).

The proportion of the structural unit (a3), relative to the combined total of all the structural units that constitute the component (A), is preferably within a range from 5 to 50 mol %, and even more preferably from 5 to 40 mol %.

Here, the expression "proportion of the structural unit (a3)" refers to the quantity of the structural unit in those cases where the structural unit (a3) includes a single type of structural unit, or in those cases where the structural unit (a3) includes a plurality of different types of structural units, refers to the combined total of that plurality of structural units. In those cases where the structural unit (a3) includes a plurality of different structural units, the proportion of each of those structurally mutually different structural units is, in the same manner as described above, greater than 0 mol %, but no higher than 100/(n−1) mol %.

Structural Units (a4) and (a5)

The component (A) may also include a structural unit (a4) derived from a (meth)acrylate ester that contains a polycyclic aliphatic hydrocarbon group, or a structural unit (a5) derived from (meth)acrylic acid, provided these structural units are different from the structural units (a1) through (a3).

Here, the expression "different from the structural units (a1) through (a3)" means these units do not duplicate the structural units (a1) through (a3), although examples of the polycyclic aliphatic hydrocarbon group (hereafter also referred to as simply "the polycyclic group") include the same multitude of polycyclic groups described above in relation to the structural units (a1) through (a3). In terms of factors such as industrial availability, one or more groups selected from amongst a tricyclodecanyl group, adamantyl group, and tetracyclododecanyl group is preferred.

Specific examples of the structural unit (a4) include units with the structures represented by the formulas (41) through (43) shown below.

[Formula 12]

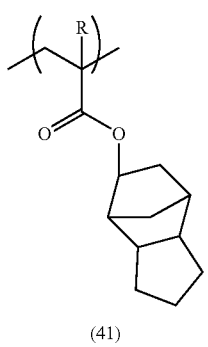

(41)

(wherein, R is as defined above)

[Formula 13]

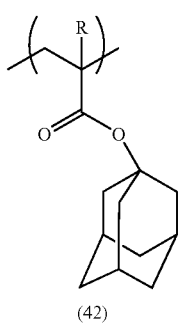

(42)

(wherein, R is as defined above)

[Formula 14]

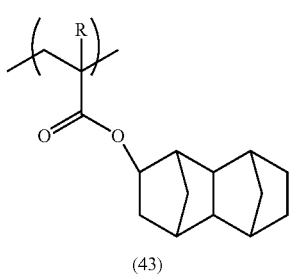

(43)

(wherein, R is as defined above)

The proportion of the structural unit (a4), relative to the combined total of all the structural units that constitute the component (A), is preferably within a range from 1 to 25 mol %, and even more preferably from 10 to 20 mol %.

The proportion of the structural unit (a5), relative to the combined total of all the structural units that constitute the component (A), is preferably within a range from 1 to 25 mol %, and even more preferably from 10 to 20 mol %.

Here, the expressions referring to the proportion of the structural unit (a4) or (a5) either refer to the quantity of the structural unit in those cases where the structural unit (a4) or (a5) includes a single type of structural unit, or in those cases where the structural unit (a4) or (a5) includes a plurality of different types of structural units, refer to the combined total of that plurality of structural units. In those cases where the structural unit (a4) or (a5) includes a plurality of different structural units, the proportion of each of those structurally mutually different structural units is, in the same manner as described above, greater than 0 mol %, but no higher than 100/(n−1) mol %.

In the component (A), the combination and relative ratios of the structural units (a1) through (a5) can be selected and adjusted in accordance with the properties required. In terms of achieving favorable resist pattern shape and resolution, the component (A) preferably contains the structural unit (a1), together with the structural unit (a2) and/or the structural unit (a3), components that contain all of the structural units (a1) through (a3) are preferred, and components formed solely from the structural units (a1) through (a3) are particularly desirable.

In the present invention, a component (A) formed from n different structural units selected from the group consisting of structural units derived from 2-alkyl-2-adamantyl (meth) acrylates, structural units derived from 1-alkyl-1-cyclopentyl (meth)acrylates, structural units derived from 1-alkyl-1-cyclohexyl (meth)acrylates, structural units derived from γ-butyrolactone (meth)acrylates, structural units derived from norbornane lactone (meth)acrylates, and structural units derived from hydroxyadamantyl (meth)acrylates yields improved levels of sensitivity, resolution, pattern shape and DOF, and is consequently preferred.

In particular, a component (A) that contains: at least one structural unit selected from the group consisting of structural units derived from 2-alkyl-2-adamantyl (meth)acrylates, structural units derived from 1-alkyl-1-cyclopentyl (meth) acrylates, and structural units derived from 1-alkyl-1-cyclohexyl (meth)acrylates as the structural unit (a1); at least one structural unit selected from the group consisting of structural units derived from γ-butyrolactone (meth)acrylates and structural units derived from norbornane lactone (meth)acrylates as the structural unit (a2); and at least one structural unit selected from the group consisting of structural units derived from hydroxyadamantyl (meth)acrylates as the structural unit (a3); and which is formed from n different structural units selected from within the above groups yields superior improvement in the levels of sensitivity, resolution, pattern shape and DOF, and is consequently particularly desirable.

Specific examples of preferred forms of the component (A) include copolymers (A1) represented by a general formula (I) shown below, and copolymers (A2) represented by a general formula (II) shown below.

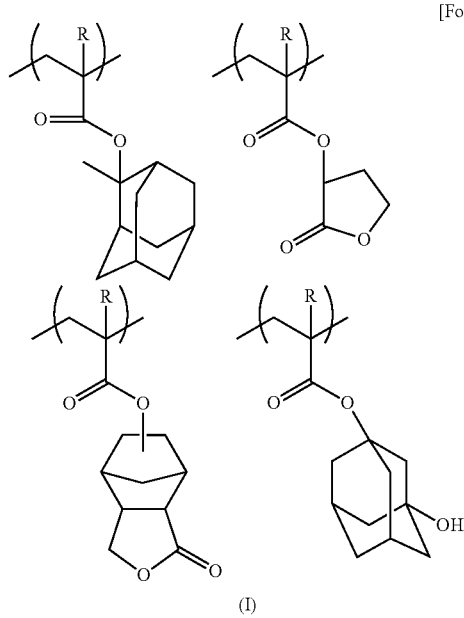

[In the formula (I), each R represents, independently, a hydrogen atom or a methyl group.]

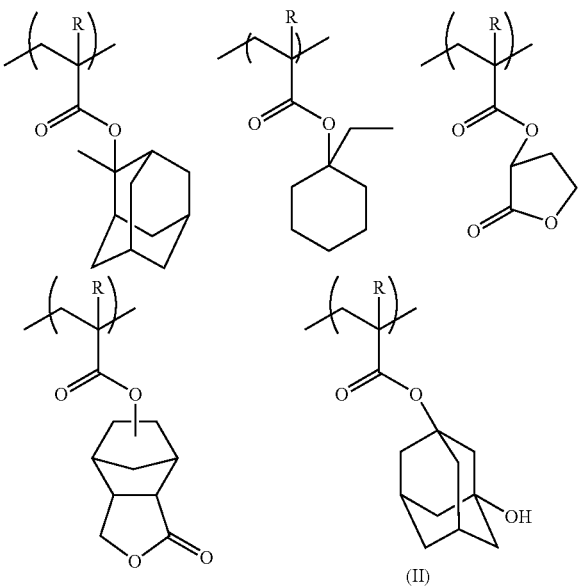

[In the formula (II), each R represents, independently, a hydrogen atom or a methyl group.]

The component (A) can be obtained, for example, by a conventional radical polymerization or the like of the monomers corresponding with each of the structural units, using a radical polymerization initiator such as azobisisobutyronitrile (AIBN).

The weight average molecular weight (the polystyrene equivalent weight average molecular weight determined by gel permeation chromatography, this also applies below) of the component (A) is preferably no higher than 30,000, and is even more preferably 15,000 or lower. Weight average molecular weights no higher than 30,000 offer various advantages, including excellent etching resistance, resistance to swelling of the resist pattern during developing, and favorable resistance to pattern collapse.

There are no particular restrictions on the lower limit, although from the viewpoints of achieving favorable resolution and favorable solubility in organic solvents, the weight average molecular weight is preferably at least 3,000, and is even more preferably 5,000 or higher.

The component (A) may include either a single polymer or a combination of two or more different polymers.

<Component (B)>

The component (B) can use any of the known acid generators used in conventional chemically amplified resist compositions without any particular restrictions.

Examples of these acid generators are numerous, and include onium salt-based acid generators such as iodonium salts and sulfonium salts, oxime sulfonate-based acid generators, diazomethane-based acid generators such as bisalkyl or bisaryl sulfonyl diazomethanes and poly(bis-sulfonyl)diazomethanes, nitrobenzyl sulfonate-based acid generators, iminosulfonate-based acid generators, and disulfone-based acid generators.

Specific examples of suitable onium salt-based acid generators include diphenyliodonium trifluoromethanesulfonate or nonafluorobutanesulfonate, bis(4-tert-butylphenyl)iodonium trifluoromethanesulfonate or nonafluorobutanesulfonate, triphenylsulfonium trifluoromethanesulfonate, heptafluoropropanesulfonate or nonafluorobutanesulfonate, tri(4-methylphenyl)sulfonium trifluoromethanesulfonate, heptafluoropropanesulfonate or nonafluorobutanesulfonate, dimethyl(4-hydroxynaphthyl)sulfonium trifluoromethanesulfonate, heptafluoropropanesulfonate or nonafluorobutanesulfonate, monophenyldimethylsulfonium trifluoromethanesulfonate, heptafluoropropanesulfonate or nonafluorobutanesulfonate, diphenylmonomethylsulfonium trifluoromethanesulfonate, heptafluoropropanesulfonate or nonafluorobutanesulfonate, (4-methylphenyl)diphenylsulfonium trifluoromethanesulfonate, heptafluoropropanesulfonate or nonafluorobutanesulfonate, (4-methoxyphenyl)diphenylsulfonium trifluoromethanesulfonate, heptafluoropropanesulfonate or nonafluorobutanesulfonate, and tri(4-tert-butyl)phenylsulfonium trifluoromethanesulfonate, heptafluoropropanesulfonate or nonafluorobutanesulfonate.

Specific examples of suitable oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)-benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile. Of these, α-(methylsulfonyloxyimino)-p-methoxyphenyl acetonitrile is preferred.

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Furthermore, specific examples of poly(bis-sulfonyl)diazomethanes include the structures shown below, such as 1,3-bisphenylsulfonyldiazomethylsulfonyl)propane (compound A, decomposition point 135° C.), 1,4-bis(phenylsulfonyldiazomethylsulfonyl)butane (compound B, decomposition point 147° C.), 1,6-bis(phenylsulfonyldiazomethylsulfonyl)hexane (compound C, melting point 132° C., decomposition point 145° C.), 1,10-bis(phenylsulfonyldiazomethylsulfonyl)decane (compound D, decomposition point 147° C.), 1,2-bis(cyclohexylsulfonyldiazomethylsulfonyl)ethane (compound E, decomposition point 149° C.), 1,3-bis(cyclohexylsulfonyldiazomethylsulfonyl)propane (compound F, decomposition point 153° C.), 1,6-bis(cyclohexylsulfonyldiazomethylsulfonyl)hexane (compound G, melting point 109° C., decomposition point 122° C.), and 1,10-bis(cyclohexylsulfonyldiazomethylsulfonyl)decane (compound H, decomposition point 116° C.).

[Formula 17]

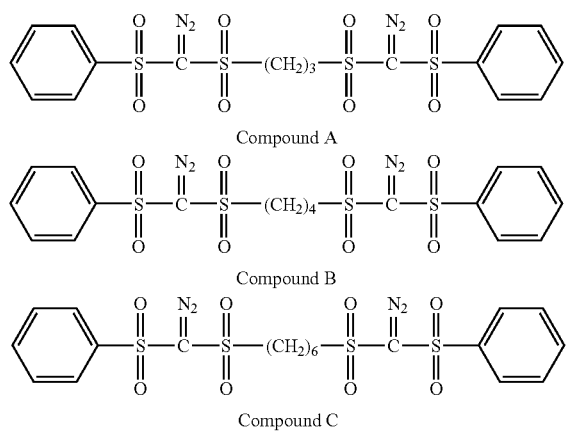

Compound A

Compound B

Compound C

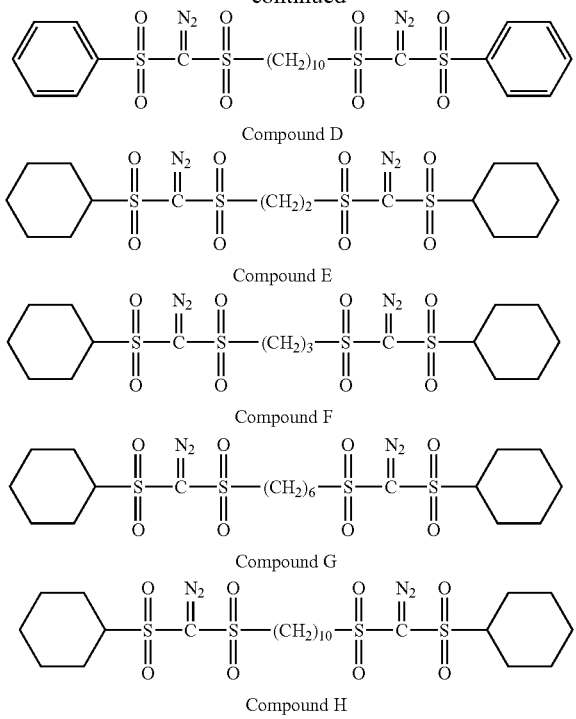

Compound D

Compound E

Compound F

Compound G

Compound H

As the component (B), either one of the above acid generators may be used alone, or a combination of two or more different acid generators may be used.

The quantity used of the component (B) is typically within a range from 0.5 to 30 parts by weight, and preferably from 1 to 10 parts by weight, per 100 parts by weight of the component (A). If the quantity is lower than the above range, there is a danger that satisfactory pattern formation may not be possible, whereas if the quantity exceeds the upper limit of the above range, obtaining a uniform solution becomes problematic, which can cause a deterioration in the storage stability.

<Component (D)>

In a positive resist composition according to the present invention, in order to improve the resist pattern shape and the post exposure stability of the latent image formed by the pattern-wise exposure of the resist layer, a nitrogen-containing organic compound (D) (hereafter referred to as the component (D)) may be added as an optional component.

A multitude of these components (D) have already been proposed, and any of these known compounds may be used, although an amine, and particularly a secondary lower aliphatic amine or tertiary lower aliphatic amine is preferred.

Here, a lower aliphatic amine refers to an alkyl or alkyl alcohol amine with the alkyl or alkyl alcohol of no more than 5 carbon atoms, and examples of these secondary and tertiary amines include trimethylamine, diethylamine, triethylamine, di-n-propylamine, tri-n-propylamine, tripentylamine, diethanolamine, triethanolamine and triisopropanolamine, and of these, tertiary alkanolamines such as triethanolamine are particularly preferred.

These compounds may be used either alone, or in combinations of two or more different compounds.

The component (D) is typically used in a quantity within a range from 0.01 to 5.0 parts by weight per 100 parts by weight of the component (A).

<Component (E)>

Furthermore, in order to prevent any deterioration in sensitivity caused by the addition of the aforementioned component (D), and improve the resist pattern shape and the post exposure stability of the latent image formed by the pattern-wise exposure of the resist layer, an organic carboxylic acid, or a phosphorus oxo acid or derivative thereof (E) may also be added as another optional component (hereafter referred to as the component (E)). The component (D) and the component (E) can be used in combination, or either one can also be used alone.

Examples of suitable organic carboxylic acids include malonic acid, citric acid, malic acid, succinic acid, benzoic acid, and salicylic acid.

Examples of suitable phosphorus oxo acids or derivatives thereof include phosphoric acid or derivatives thereof such as esters, including phosphoric acid, di-n-butyl phosphate, and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid, and of these, phosphonic acid is particularly preferred.

The component (E) is typically used in a quantity within a range from 0.01 to 5.0 parts by weight per 100 parts by weight of the component (A).

<Other Optional Components>

Other miscible additives may also be added to a positive resist composition of the first embodiment of the present invention according to need, and examples include additive resins for improving the properties of the resist film, surfactants for improving the ease of application, dissolution inhibitors, plasticizers, stabilizers, colorants, and halation prevention agents.

<Organic Solvent>

A positive resist composition of the present invention can be produced by dissolving the materials in an organic solvent.

The organic solvent may be any solvent capable of dissolving the various components to generate a uniform solution, and one or more solvents selected from known materials used as the solvents for conventional chemically amplified resists can be used.

Specific examples of the solvent include lactones such as γ-butyrolactone; ketones such as acetone, methyl ethyl ketone, cyclohexanone, methyl isoamyl ketone and 2-heptanone; polyhydric alcohols and derivatives thereof such as ethylene glycol, ethylene glycol monoacetate, diethylene glycol, diethylene glycol monoacetate, propylene glycol, propylene glycol monoacetate, dipropylene glycol, or the monomethyl ether, monoethyl ether, monopropyl ether, monobutyl ether or monophenyl ether of dipropylene glycol monoacetate; cyclic ethers such as dioxane; and esters such as methyl lactate, ethyl lactate (EL), methyl acetate, ethyl acetate, butyl acetate, methyl pyruvate, ethyl pyruvate, methyl methoxypropionate, and ethyl ethoxypropionate.

These organic solvents may be used either alone, or as a mixed solvent of two or more different solvents.

Furthermore, mixed solvents prepared by mixing propylene glycol monomethyl ether acetate (PGMEA) and a polar solvent are preferred, and although the blend ratio (weight ratio) in such mixed solvents can be set in accordance with factors such as the co-solubility of the PGMEA and the polar solvent, the ratio is preferably within a range from 1:9 to 9:1, and even more preferably from 2:8 to 8:2.

More specifically, in those cases where EL is added as the polar solvent, the weight ratio PGMEA:EL is preferably within a range from 2:8 to 8:2, and even more preferably from 3:7 to 7:3.

Furthermore, as the organic solvent, mixed solvents containing at least one of PGMEA and EL, together with γ-butyrolactone, are also preferred. In such cases, the weight ratio of the former and latter components in the mixed solvent is preferably within a range from 70:30 to 95:5.

There are no particular restrictions on the quantity used of the organic solvent, although the quantity should provide a concentration that enables favorable application of the solution to a support such as a substrate or the like, and should be set in accordance with the required coating film thickness, and is typically set so that the solid fraction concentration within the resist composition falls within a range from 2 to 20% by weight, and even more preferably from 5 to 15% by weight.

<<Method for Resist Pattern Formation>>

A method for resist pattern formation that uses a positive resist composition according to the present invention can be conducted, for example, in the manner described below.

Namely, a positive resist composition described above is first applied to a support such as a silicon wafer using a spinner or the like, a prebake is then conducted under temperature conditions of 80 to 150° C., for a period of 40 to 120 seconds, and preferably for 60 to 90 seconds, and following selective exposure (irradiation) of the thus obtained film with an ArF exposure apparatus or the like, by irradiating ArF excimer laser light through a desired mask pattern, PEB (post exposure baking) is conducted under temperature conditions of 80 to 150° C., for a period of 40 to 120 seconds, and preferably for 60 to 90 seconds. Subsequently, developing is conducted using an alkali developing solution such as a 0.1 to 10% by weight aqueous solution of tetramethylammonium hydroxide. In this manner, a resist pattern that is faithful to the mask pattern can be obtained.

An organic or inorganic anti-reflective film may also be provided between the support (substrate) and the applied layer of the resist composition.

As the support, conventional materials can be used without any particular restrictions, and suitable examples include substrates for electronic componentry, as well as substrates on which a predetermined wiring pattern has already been formed.

Specific examples of suitable substrates include silicon wafers, metal-based substrates such as copper, chrome, iron, and aluminum, as well as glass substrates.

Suitable materials for the wiring pattern include copper, solder, chrome, aluminum, nickel, and gold.

There are no particular restrictions on the wavelength used for the exposure (irradiation), and an ArF excimer laser, KrF excimer laser, $F_2$ excimer laser, or other radiation such as EUV (extreme ultraviolet), VUV (vacuum ultraviolet), EB (electron beam), X-ray or soft X-ray radiation can be used. A positive resist composition according to the present invention is particularly effective for use with an ArF excimer laser.

EXAMPLES

As follows is a more detailed description of the present invention using a series of examples, although the present invention is in no way limited by these examples.

Reference Example 1

A resin 1 represented by a formula (a-1) shown below (n/m/l/k=30/30/20/20 (molar ratio)) and with a weight average molecular weight of 10,000 was prepared.

n: 2-methyl-2-adamantyl methacrylate m: γ-butyrolactone methacrylate l: norbornane lactone methacrylate k: 3-hydroxy-1-adamantyl acrylate

[Formula 18]

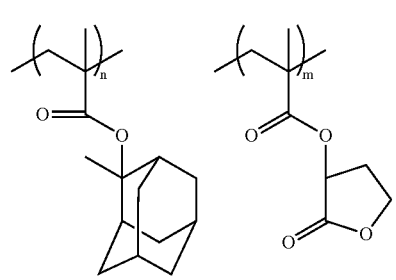

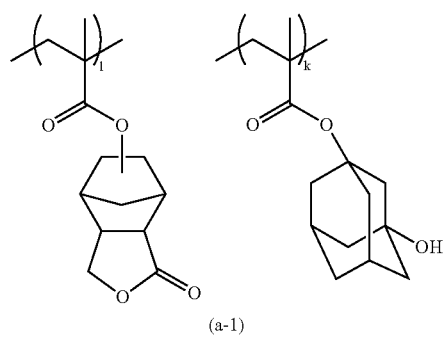

(a-1)

Reference Example 2

A comparative resin 1 represented by a formula (a'-1) shown below (n/n/l=30/50/20 (molar ratio)) and with a weight average molecular weight of 10,000 was prepared.

n: 2-methyl-2-adamantyl methacrylate m: γ-butyrolactone methacrylate l: 3-hydroxy-1-adamantyl acrylate

[Formula 19]

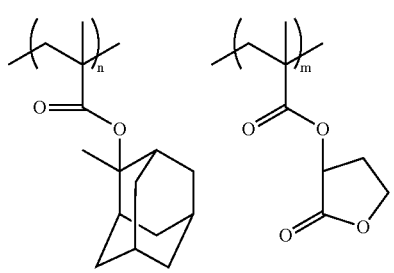

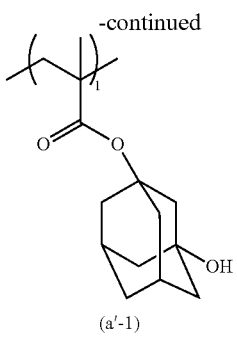

(a'-1)

Example 1

A positive resist composition of the composition described below was prepared, and was then evaluated in the manner described below.
Component (A): resin 1 (100 parts by weight).
Component (B): 4-methylphenyldiphenylsulfonium nonafluorobutanesulfonate represented by the formula (b-1) shown below (2.5 parts by weight), and tri(4-tert-butylphenyl)sulfonium trifluoromethanesulfonate represented by the formula (b-2) shown below (0.8 parts by weight).
Component (D): triethanolamine (0.25 parts by weight).
Organic solvent: a mixed solvent of PGMEA/EL (weight ratio: 8/2) (in sufficient quantity to yield a solid fraction concentration within the resist composition of 8% by weight).

[Formula 20]

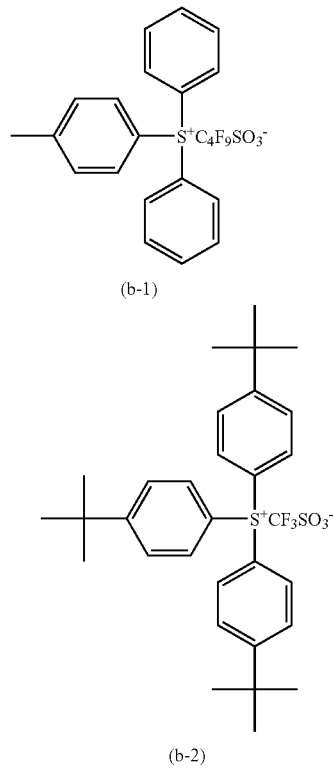

(b-1)

(b-2)

(Evaluation of DOF)
Using the thus obtained positive resist composition, a resist pattern was formed in the manner described below.
An organic anti-reflective film composition ARC-29A (a product name, manufactured by Brewer Science Ltd.) was applied to the surface of an 8-inch silicon wafer using a spinner, and the composition was then baked and dried on a hotplate at 215° C. for 60 seconds, thereby forming an organic anti-reflective film with a film thickness of 77 nm.

The positive resist composition prepared above was then applied to the surface of this organic anti-reflective film using a spinner, and was then prebaked (PAB) and dried on a hotplate at 125° C. for 60 seconds, thereby forming a resist layer with a thickness of 260 nm.

The thus obtained resist layer was then selectively irradiated with an ArF excimer laser (193 nm) through a (binary) mask pattern, using an ArF exposure apparatus NSR-S302 (manufactured by Nikon Corporation; NA (numerical aperture)=0.60, ⅔ annular illumination).

A PEB treatment was then conducted at 125° C. for 60 seconds, and the resist layer was subjected to puddle development for 30 seconds at 23° C. in a 2.38% by weight aqueous solution of tetramethylammonium hydroxide (TMAH), and was then washed for 20 seconds with water and dried, thereby completing formation of a resist pattern.

The pattern formed was a trench pattern with a space width of 130 nm and a pitch of 1430 nm (namely, a pattern in which space patterns of width 130 nm were disposed at 1300 nm intervals). The exposure dose Eop during formation of the pattern was 28 mJ/cm$^2$, and the pattern shape was favorable.

Using the exposure dose Eop described above, resist pattern formation was conducted in the same manner as above, but with the focal depth offset up or down, and the depth of focus (DOF) range for which a pattern could be formed within ±10% of the set dimensions was determined. The result revealed a pattern DOF of 0.4 μm.

Comparative Example 1

With the exception of using the comparative resin 1 as the component (A), a positive resist composition was prepared in the same manner as the example 1.

Using the thus obtained positive resist composition, and with the exception of altering the temperature for the PAB and PEB treatments to 120° C., a resist pattern was formed and then evaluated in the same manner as the example 1.

The results revealed an exposure dose Eop for the same trench pattern of 25 mJ/cm$^2$. Furthermore, the DOF was 0.3 μm.

In the example 1 and the comparative example 1 the difference in the trench pattern DOF values was only 0.1 μm, but increasing the DOF value for a trench pattern is far from simple, and even this small difference has an extremely significant technical effect. Furthermore, although the sensitivity is slightly lower in the comparative example 1, both values represent satisfactory numerical values for practical application.

The invention claimed is:
1. A positive resist composition, comprising a resin component (A) that exhibits increased alkali solubility under action of acid, and an acid generator component (B) that generates acid upon exposure, wherein
 (i) said component (A) is a quarternary copolymer that structural units with mutually different structures, and
 (ii) a proportion of each structural unit within said copolymer 18 to 32 mol %, and the total of the structural units is 100 mol %,
 (iii) wherein said component (A) comprises structural units
  (a) derived from (meth)acrylate esters,

(iv) wherein said structural units (a) comprise a structural unit (a1) derived from a (meth)acrylate ester that contains an acid-dissociable, dissolution-inhibiting group and structural units (a2) derived from (meth)acrylate esters that contain lactone-containing cyclic groups represented by the following formulas (21) and (24):

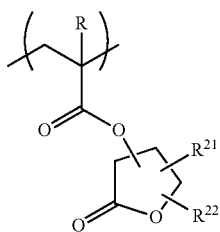
(21)

[wherein in the formula (21), R represents a hydrogen atom or a methyl group, and $R^{21}$ and $R^{22}$ each represent, independently, a hydrogen atom or a lower alkyl group], and

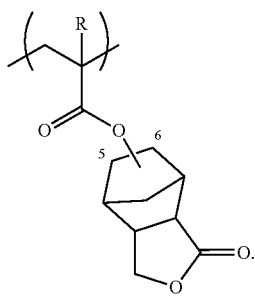
(24)

2. A positive resist composition according to claim 1, wherein said structural unit (a1) is a structural unit derived from a (meth)acrylate ester that contains an aliphatic cyclic group-containing acid-dissociable, dissolution-inhibiting group.

3. A positive resist composition according to claim 2, wherein said structural unit (a1) comprises at least one structural unit selected from the group consisting of structural units derived from 2-alkyl-2-adamantyl (meth)acrylates, structural units derived from 1-alkyl-1-cyclopentyl (meth)acrylates and structural units derived from 1-alkyl-1-cyclohexyl (meth)acrylates.

4. A positive resist composition according to claim 1, wherein said structural units (a) further comprise a structural unit (a3) derived from a (meth)acrylate ester that contains a polar group-containing aliphatic hydrocarbon group.

5. A positive resist composition according to claim 4, wherein said structural unit (a3) comprises at least one structural unit selected from the group consisting of structural units derived from hydroxyadamantyl (meth)acrylates.

6. A positive resist composition according to claim 4, wherein said structural unit (a1) comprises at least one structural unit selected from the group consisting of structural units derived from 2-alkyl-2-adamantyl (meth)acrylates, structural units derived from 1-alkyl-1-cyclopentyl (meth)acrylates and structural units derived from 1-alkyl-1-cyclohexyl (meth)acrylates.

7. A positive resist composition according to claim 1, further comprising a nitrogen-containing organic compound.

8. A method for resist pattern formation, comprising:
forming a resist film on a substrate using a positive resist composition according to claim 1;
conducting selective exposure of said resist film; and
subsequently conducting alkali developing to form a resist pattern.

9. A positive resist composition comprising a resin component (A) that exhibits increased alkali solubility under action of acid, and an acid generator component (B) that generates acid upon exposure, wherein
said component (A) is a quinary copolymer that comprises 5 structural units with mutually different structures, and wherein a proportion of each structural unit within said copolymer is 15 to 24 mol % and the total of the structural units is 100 mol %,
wherein said component (A) comprises structural units (a2) derived from (meth)acrylate esters that contain lactone-containing cyclic groups.

10. A positive resist composition according to claim 9, wherein the structural units (a2) are represented by the following formulas (21) and (24):

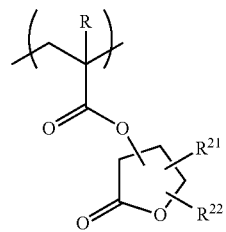
(21)

[wherein in the formula (21), R represents a hydrogen atom or a methyl group, and $R^{21}$ and $R^{22}$ each represent, independently, a hydrogen atom or a lower alkyl group], and

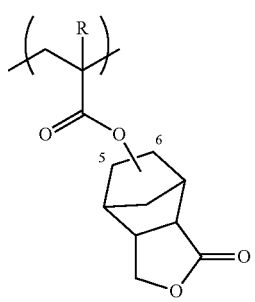
(24)

[wherein in the formula (24), R is as defined above].

* * * * *

UNITED STATES PATENT AND TRADEMARK OFFICE
CERTIFICATE OF CORRECTION

PATENT NO.        : 8,029,968 B2
APPLICATION NO.   : 11/570399
DATED             : October 4, 2011
INVENTOR(S)       : Ryotaro Hayashi, Satoshi Yamada and Makiko Irie It is certified that error appears in the above-identified patent and that said Letters Patent is hereby corrected as shown below:

In Column 3, Line 24, Change "25 mol %." to --=25 mol %.--.

In Column 7, Line 22, Change "FIGURE," to --formula (13),--.

In Column 16, Line 26, Change "bis(p-toluenesulfonyldiazomethane," to --bis(p-toluenesulfonyl)diazomethane,--.

In Column 16, Line 32, Change "bisphenylsulfonyldiazomethylsulfonyl)propane" to -- bis(phenylsulfonyldiazomethylsulfonyl)propane--.

In Column 20, Line 48, Change "(n/n/l" to --(n/m/l--.

In Column 22, Line 47, Change "example 1" to --example 1,--.

In Column 23, Lines 25-35, In Claim 1, change " 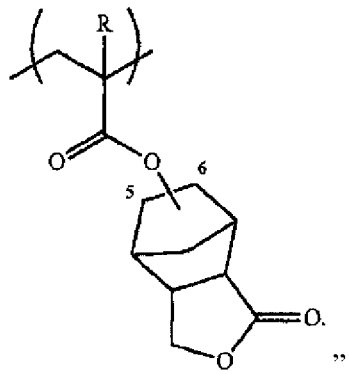 "

Signed and Sealed this
Seventeenth Day of April, 2012

David J. Kappos
*Director of the United States Patent and Trademark Office*

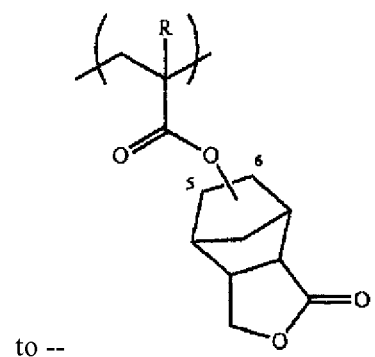
to --
[wherein in the formula (24), R is as defined above].--.